(12) United States Patent
Hashim et al.

(10) Patent No.: US 12,368,437 B2
(45) Date of Patent: Jul. 22, 2025

(54) HIGH VOLTAGE CONVERTER POWER STAGE

(71) Applicant: Texas Instruments Incorporated, Dallas, TX (US)

(72) Inventors: Ahmed Essam Hashim, Gilbert, AZ (US); Kevin Scoones, San Jose, CA (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 98 days.

(21) Appl. No.: 18/461,648

(22) Filed: Sep. 6, 2023

(65) Prior Publication Data

US 2025/0080108 A1 Mar. 6, 2025

(51) Int. Cl.
*H03K 17/687* (2006.01)
*H02M 3/158* (2006.01)
*H03K 17/22* (2006.01)

(52) U.S. Cl.
CPC .......... *H03K 17/687* (2013.01); *H02M 3/158* (2013.01); *H03K 17/223* (2013.01); *H03K 2217/0063* (2013.01); *H03K 2217/0072* (2013.01)

(58) Field of Classification Search
None
See application file for complete search history.

(56) References Cited

U.S. PATENT DOCUMENTS

| | | | |
|---|---|---|---|
| 4,459,498 A * | 7/1984 | Stengl .................. | H03K 17/102 327/541 |
| 4,692,643 A * | 9/1987 | Tokunaga ............ | H03K 17/102 327/440 |
| 4,751,408 A * | 6/1988 | Rambert .............. | H03K 17/102 327/581 |
| 5,440,249 A | 8/1995 | Schucker et al. | |
| 5,748,040 A | 5/1998 | Yeung | |
| 6,590,443 B1 | 7/2003 | Vu | |
| 6,815,845 B1 * | 11/2004 | McCallum .......... | H02M 7/5387 361/84 |
| 7,429,873 B2 | 9/2008 | Peschke | |
| 7,561,446 B1 * | 7/2009 | Vinciarelli ............. | H02M 1/34 363/16 |
| 7,808,756 B2 * | 10/2010 | Liu ........................ | H02M 1/32 361/86 |

(Continued)

FOREIGN PATENT DOCUMENTS

EP 3444949 A1 2/2019

OTHER PUBLICATIONS

International Search Report mailed Dec. 16, 2024.

*Primary Examiner* — Thomas J. Hiltunen
(74) *Attorney, Agent, or Firm* — Valerie M. Davis; Frank D. Cimino

(57) ABSTRACT

Described embodiments include a power driver circuit having a first transistor coupled between an input voltage terminal and an intermediate terminal, and having a first control terminal. A second transistor is coupled between the intermediate terminal and a switching terminal, and has a second control terminal coupled to an output of a gate drive circuit. A first diode has a first anode coupled to the input voltage terminal, and a first cathode coupled to the first control terminal through a resistor. A first voltage clamp circuit is coupled between the first control terminal and the intermediate terminal. A second voltage clamp circuit is coupled between the first control terminal and the switching terminal. A second diode is coupled between the first control terminal and a voltage supply terminal.

21 Claims, 3 Drawing Sheets

(56) References Cited

U.S. PATENT DOCUMENTS

| | | | |
|---|---|---|---|
| 8,570,093 B2 * | 10/2013 | Grimm | H02M 3/33507 |
| | | | 327/309 |
| 8,760,214 B2 * | 6/2014 | Biela | H03K 17/102 |
| | | | 327/430 |
| 9,843,293 B1 | 12/2017 | Wagh et al. | |
| 9,857,818 B1 | 1/2018 | Adamski | |
| 11,025,207 B2 | 6/2021 | Pal et al. | |
| 11,664,769 B2 | 5/2023 | Klaren et al. | |
| 12,149,170 B2 * | 11/2024 | Tang | H02M 1/0009 |
| 2011/0148368 A1 | 6/2011 | Burns | |
| 2013/0083580 A1 * | 4/2013 | Komiya | H02M 1/088 |
| | | | 62/132 |
| 2013/0258721 A1 * | 10/2013 | Boulharts | H02M 3/33538 |
| | | | 363/21.04 |
| 2014/0002051 A1 | 1/2014 | Grimm | |
| 2016/0018876 A1 | 1/2016 | Strijker | |
| 2018/0254745 A1 | 9/2018 | Kovac | |
| 2020/0195246 A1 * | 6/2020 | Randolph | H03K 17/04123 |

* cited by examiner

HIGH VOLTAGE CONVERTER POWER STAGE

BACKGROUND

This description relates to voltage converters, such as high voltage buck voltage converters. A buck voltage converter takes an input voltage at a higher voltage and produces an output voltage at a lower voltage. Typically, many buck voltage converters operate with input voltages lower than 100V, which allows them to be fabricated in standard lower voltage semiconductor processes. However, devices having an input voltage of 200V or higher may require an alternative approach, such as fabricating the device in a high voltage semiconductor process.

While higher voltage semiconductor processes are available, they typically have a thicker epitaxial layer than lower voltage semiconductor processes. The thicker epitaxial layer makes the device on-resistance significantly higher than the on-resistance of a device fabricated in a lower voltage process. The on-resistance is typically an important specification in many devices. For example, a buck voltage converter may have a specification that the power switches have an on-resistance of no more than 1 ohm in some cases, or 0.5 ohm in some other cases. The die size of a power transistor may be significantly larger in a higher voltage semiconductor process than in a lower voltage semiconductor process to achieve the same on-resistance.

SUMMARY

In a first example, a power driver circuit includes a first transistor coupled between an input voltage terminal and an intermediate terminal. The first transistor has a first control terminal, and the first transistor has a first maximum voltage rating. A second transistor having a second maximum voltage rating is coupled between the intermediate terminal and a switching terminal, and has a second control terminal coupled to an output of a gate drive circuit.

A first diode has a first anode and a first cathode, wherein the first anode is coupled to the input voltage terminal. A resistor is coupled between the first cathode and the first control terminal. A first voltage clamp circuit is coupled between the first control terminal and the intermediate terminal. A second voltage clamp circuit is coupled between the first control terminal and the switching terminal. A second diode is coupled between the first control terminal and a voltage supply terminal.

In a second example, a voltage regulator circuit includes a gate drive circuit having a supply input terminal and a gate drive output, wherein the supply input terminal is coupled to a voltage supply terminal. A first transistor is coupled between an input voltage terminal and an intermediate terminal, and has a first control terminal. The first transistor has a first maximum voltage rating.

A second transistor is coupled between the intermediate terminal and a switching terminal, and has a second control terminal. The second control terminal is coupled to the gate drive output, and the second transistor has a second maximum voltage rating. A first diode has a first anode and a first cathode, wherein the first anode is coupled to the input voltage terminal. A resistor is coupled between the first cathode and the first control terminal. A first voltage clamp circuit is coupled between the first control terminal and the intermediate terminal. A second voltage clamp circuit is coupled between the first control terminal and the switching terminal. A second diode is coupled between the first control terminal and a voltage supply terminal.

DETAILED DESCRIPTION

In this description, the same reference numbers depict same or similar (by function and/or structure) features. The drawings are not necessarily drawn to scale.

Power transistors that are used in switching converters, or other applications that may require a high voltage transistor, are usually field effect transistors (FETs). However, other types of transistors, such as bipolar transistors, may be used instead of FETs. If a bipolar transistor is used, the base, collector and emitter may be substituted for the gate, drain and source, respectively, in this description.

A transistor having a lower drain-to-source on-resistance ($R_{DSON}$) has a higher power efficiency than a transistor having a higher $R_{DSON}$ because the resistive power consumption is lower for a device having a lower $R_{DSON}$. However, many semiconductor processes that provide a low $R_{DSON}$ in a relatively small die area do not support high voltage applications. Conversely, many semiconductor processes that support high voltage applications have a higher $R_{DSON}$ for a given die area compared to a lower voltage process, thereby increasing the power consumption of the device and lowering the power efficiency of the device. Many high voltage processes have a lower specific resistance ($R_{SP}$) than lower voltage processes. So, a larger die area is required in a higher voltage process to achieve the same $R_{DSON}$, thus increasing the die cost.

Some systems that use switching power converters may have an input voltage of over 200 V on the voltage supply line. For example, an end equipment may receive its power from a wall outlet. In this case, the voltage from the wall supply may be 120 volts or 220 volts, which may then get boosted up to a voltage of 400V. The full input voltage may be applied across the power switch in a buck voltage converter.

For this reason, the FETs used in a buck voltage converter may be required to withstand a high voltage from drain to source. There are two specifications that must be met to ensure reliability of a FET device: (1) the maximum drain to source voltage rating of the FET, and (2) the maximum isolation or NBL (n-buried layer) to substrate voltage rating. Both of these maximum voltage specifications must be satisfied to avoid damaging the FET.

Figure 1:
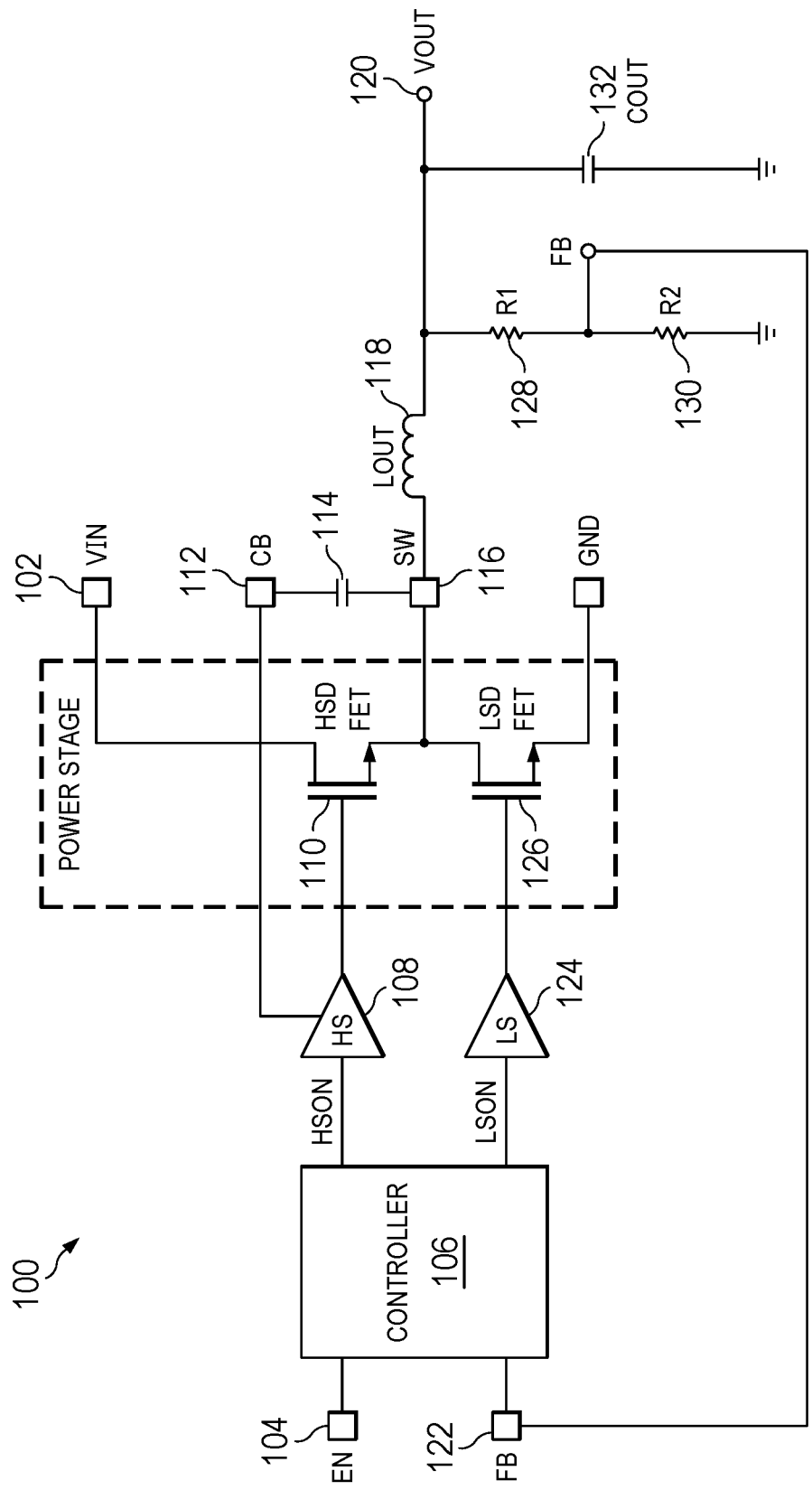
FIG. 1 shows a schematic diagram for an example DC-DC power converter.

FIG. 1 shows a schematic diagram for an example DC-DC power converter 100. The input voltage terminal VIN 102 receives a DC voltage to be converted to a regulated voltage and provided at the output voltage terminal VOUT 120. A power stage includes high side drive transistor 110 and low side drive transistor 126, which are coupled in series between the input voltage terminal VIN 102 and a ground terminal GND. The gate of high side drive transistor 110 is driven by high side driver 108, and the gate of low side drive transistor 126 is driven by low side driver 124. High side driver 108 and low side driver 124 are each controlled by a controller 106 which provides their respective inputs.

High side drive transistor 110 is coupled between input voltage terminal VIN 102 and a switching terminal SW 116. Low side drive transistor 126 is coupled between the switching terminal SW116 and the ground terminal GND. A first input of controller 106 is coupled to an enable terminal EN 104, which may receive an enable signal from a system control device (not shown). A second input of controller 106 is coupled to a feedback terminal FB 122.

A first output of controller 106 is coupled to the input of high side driver 108. A second output of controller 106 is coupled to the input of low side driver 124. The output of high side driver 108 is coupled to the gate of high side drive transistor 110 and provides a switching signal for turning high side drive transistor 110 off and on. The output of low side driver 124 is coupled to the gate of low side drive transistor 126 and provides a switching signal for turning low side drive transistor 126 off and on. Controller 106 controls the duration and timing for when high side drive transistor 110 and low side drive transistor 126 are each on, and ensures that high side drive transistor 110 and low side drive transistor 126 are never turned on at the same time to prevent a short circuit between the input voltage terminal VIN 102 and the ground terminal GND.

A bootstrap capacitor 114 may be coupled between a boost terminal 112 and the switching terminal SW 116. The boost terminal 112 is coupled to the supply terminal of high side driver 108 and can provide a voltage that is higher than the voltage at the input voltage terminal VIN 102. The boosted voltage at the supply terminal of high side driver 108 allows the proper operation of high side drive transistor 110, which is an n-channel FET (NFET) by providing a voltage to the gate of high side drive transistor 110 that is higher than the voltage at the input voltage terminal VIN 102.

Inductor 118 is coupled between the switching terminal SW 116 and the output voltage terminal VOUT 120. Resistors 128 and 130 are coupled in series between the output voltage terminal VOUT 120 and the ground terminal GND. The feedback terminal FB 122 is coupled to the connection terminal between resistors 128 and 130. Capacitor 132 is coupled between the output voltage terminal VOUT 120 and ground.

Controller 106 receives an enable signal from the enable terminal EN 104. When the enable signal is asserted, controller 106 provides control signals HSON and LSON at its outputs. HSON controls turning high side drive transistor 110 off and on through high side driver 108. The signal LSON controls turning low side drive transistor 126 off and on through low side driver 124. Controller 106 generates the signals HSON and LSON to maintain a particular voltage at the output voltage terminal VOUT 120 in response to the voltage at feedback terminal FB 122, which is proportional to the voltage at the output voltage terminal VOUT 120.

If a voltage supplied at the input voltage terminal VIN 102 is less than the maximum voltage rating of the high side drive transistor 110 and low side drive transistor 126, the circuit configuration of DC-DC power converter 100 should be capable of operating without destroying high side drive transistor 110 and low side drive transistor 126 due to excessive drain-to-source voltage. However, if the circuit configuration of DC-DC converter 100 is used in a case where the voltage supplied at the input voltage terminal VIN 102 is greater than the maximum voltage rating of the high side drive transistor 110 and the low side drive transistor 126, high side drive transistor 110 and low side drive transistor 126 may fail.

For example, a DC-DC power converter may be specified to operate with an input voltage up to a maximum of 200 volts with an $R_{DSON}$ of one ohm. If the whole circuit including the high side drive transistor and the low side drive transistor is fabricated in a process rated for a maximum of 120 volts, the circuit may have a serious reliability problem that could lead to failure of the high side drive transistor and the low side drive transistor. This reliability problem may be alleviated by fabricating the circuit in a high voltage process, such as a process rated for 200 volts or more. However, the high voltage process may have a higher specific resistance, making the die size of the high side drive transistor and the low side drive transistor significantly larger to meet the one ohm $R_{DSON}$ requirement, increasing the cost of the die.

An alternative solution is to fabricate the circuit on two separate dies and package the two dies in a multi-chip module (MCM). The first die in the MCM could be fabricated in a higher voltage process and contain only the high side drive transistor and the low side drive transistor. The second die in the MCM could be fabricated in a lower voltage process and contain the rest of the regulator circuitry. While this solution may provide a lower die cost in comparison to the die cost of fabricating the whole circuit in the higher voltage process, the MCM would have a higher assembly and packaging cost, making an MCM a less attractive solution.

A second potential solution allows the use of a lower voltage semiconductor process while alleviating the need for an MCM. However, this second solution also has certain limitations. The second solution is to replace the high side drive transistor with a stack of two transistors cascoded in series, and replace the low side drive transistor with a second stack of two transistors cascoded in series.

Figure 2:
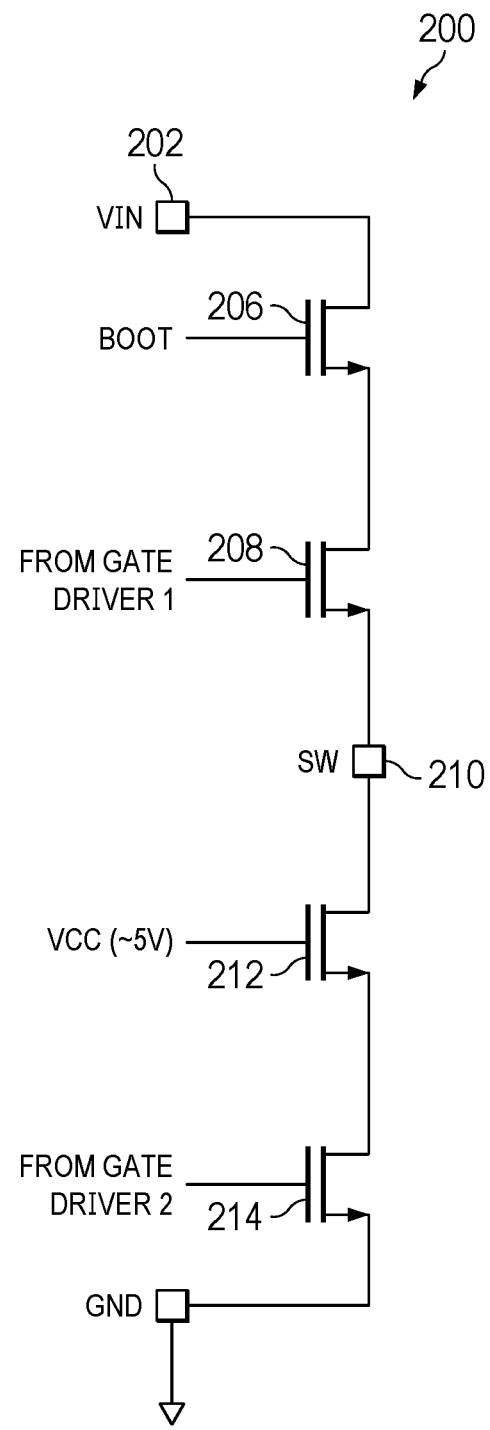
FIG. 2 shows a schematic diagram for an example power stage having cascoded high side and low side transistors.

FIG. 2 shows a schematic diagram for an example power stage 200 having cascoded high side and low side transistors. This cascoded transistor configuration may be used in switching power regulators and other applications that have a requirement to operate with higher input voltages. The maximum rated voltage of the high side transistors and of the low side transistors, respectively, is the sum of the maximum voltage ratings of each of the respective two cascoded transistors. The input voltage terminal VIN 202 receives a DC voltage from a DC power source.

Power stage 200 includes transistors 206, 208, 212 and 214. In at least one example, transistors 206 and 212 are rated for a maximum drain to source voltage of 100V, and transistors 208 and 214 are rated for a maximum drain to source voltage of 5V. Transistor 208 receives a first pulse width modulated (pwm) signal at its gate from a first gate driver circuit (not shown). Transistor 214 receives a second pwm signal at its gate from a second gate driver circuit (not shown). In at least one case, the first pwm signal received at the gate of transistor 208 is 180 degrees out of phase with the second pwm signal received at the gate of transistor 214. Transistors 208 and 214 perform a switching function in the power regulator to maintain the specified regulated voltage at an output voltage terminal. Transistors 206 and 212 each have a respective maximum voltage rating of 100V that is added to the 5V maximum voltage ratings of transistors 208 and 214, respectively, making the maximum voltage rating of each cascoded pair 105V.

The source of transistor 206 is coupled to the input voltage terminal VIN 202. The gate of transistor 206 is coupled to a constant DC voltage source, which in at least one case may be equal to 5V, or in another case may be a boosted bias voltage BOOT that is equal to the voltage at switching terminal SW 210 plus 5V. It may be necessary to provide a boosted bias voltage to the gate of transistor 206 to turn on transistor 206 if transistor 206 is an n-channel FET and the voltage at the source of transistor 206 is at the voltage of the input voltage terminal VIN 202.

The drain of transistor 206 is coupled to the source of transistor 208, and the drain of transistor 208 is coupled to the switching terminal SW 210. The first pwm signal has a varying duty cycle that is provided to the gate of transistor 208, causing transistor 208 to turn on or off, alternately connecting the voltage at the input voltage terminal VIN 202 to the switching terminal SW 210. The duty cycle of the first and second pwm signals are adjusted dynamically as the circuit operates to maintain a specified voltage at the power converter output terminal.

The source of transistor 212 is coupled to the switching terminal SW 210. The gate of transistor 212 can be biased with a DC voltage (e.g. 5V) to ensure that transistor 212 turns on and conducts whenever transistor 214 is turned on. The drain of transistor 212 is coupled to the source of transistor 214, and the drain of transistor 214 is coupled to the ground terminal GND.

The second pwm signal has a varying duty cycle and is provided to the gate of transistor 214, causing transistor 214 to turn on or off, alternately connecting the ground terminal GND to the switching terminal SW 210. The first and second pwm signals are timed to ensure that transistor 214 is off whenever transistor 208 is turned on, and that transistor 208 is turned off whenever transistor 214 is turned on to avoid shorting the input voltage terminal VIN 202 to GND.

In power stage 200, the gate of transistor 212 is connected to a DC voltage source, and transistor 212 is always on whenever transistor 214 is on. Transistor 214 is switched on and off to regulate an output voltage. If transistor 214 is turned off, there is no current path for current to flow through transistor 212. Therefore, the voltage at the source of transistor 212 will be pulled up to near the same voltage as the gate of transistor 212, turning the transistor off.

The control of the transistors in power stage 200 is relatively simple because the gate of each respective top transistor in each pair (i.e. 206, 212) is connected to a DC voltage within the circuit (BOOT for the high side, or VCC for the low side). So, each respective top transistor of each pair will be turned on when its respective bottom transistor is turned on, and will be turned off when its respective bottom transistor is turned off. Although power stage 200 has an advantage of having relatively simple control of the transistors, it comes with a limitation in high input voltage applications.

In a circuit where the gate of the top transistor receives a DC supply voltage VDD, the drain-to-source voltage rating of the bottom transistor is limited to VDD. For example, if the gate of transistor 212 is connected to a 5V DC supply, transistor 214 only adds 5V to the voltage rating of transistor 212 for the total voltage rating of the transistor pair. So, if transistor 212 is a 100V rated device, transistors 212 and 214 together would only be rated to 105V. For systems having a higher maximum input voltage than that, an alternative circuit is needed.

Two specifications that must be met to ensure reliable operation of the transistors: (1) the maximum drain to source voltage rating of the transistor, and (2) the maximum NBL to substrate voltage rating of the transistor. In a circuit where transistors are cascoded together to increase the maximum voltage ratings, it is important to ensure that the voltage is shared proportionately between the cascoded transistors when the transistors are turned off, but that each of the transistors are well-enhanced when the transistors are turned on. This may require a more complicated control circuit than the control circuit of power stage 200.

Figure 3:
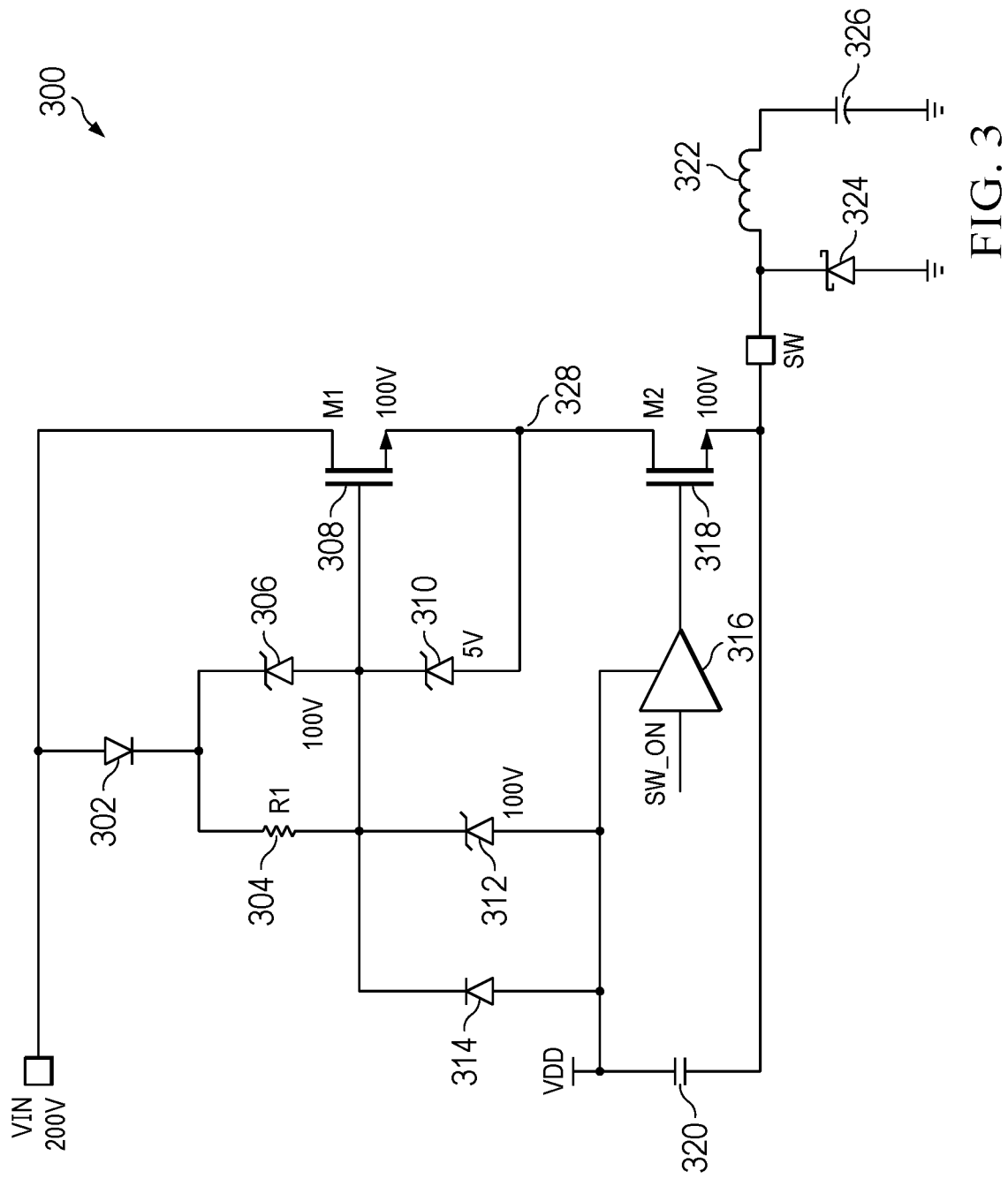
FIG. 3 shows a schematic diagram for an example high voltage drive circuit using cascoded transistors.

FIG. 3 shows a schematic diagram for an example high voltage drive circuit 300 using cascoded transistors. High voltage drive circuit 300 can be used in a voltage converter, such as a high voltage buck converter. In at least one example, the voltage at the input voltage terminal VIN may be 200V. Transistor 308 is an n-channel field effect transistor (NFET) in at least one case, but may be some other type of transistor in other cases. Transistor 308 is coupled between the input voltage terminal VIN and an intermediate terminal 328.

Diode 302 has an anode coupled to the input voltage terminal VIN, and a cathode coupled to a first terminal of a clamp circuit 306. Clamp circuit 306 is a circuit that clamps the voltage between its first and second terminals to a voltage no higher than 100V. The clamping voltage of clamp circuit 306 may be different in other circuits and should be adjusted to match the drain-to-source voltage rating of transistor 308. Clamp circuit 306 could be a series stack of zener diodes, a single 100V avalanche diode, multiple avalanche diodes in series adding to 100V, or any other circuitry suitable for clamping the voltage between its terminals to 100V. A second terminal of clamp circuit 306 is coupled to the gate of transistor 308. A resistor 304 is coupled in parallel with clamp circuit 306.

Clamp circuit 310 is coupled between the gate and source of transistor 308 and clamps the voltage between the gate and the source of transistor 308 to a voltage no greater than 5V in at least one example. The clamping voltage of clamp circuit should be set equal to the voltage of DC supply voltage VDD, so it could be at a different voltage in another example. Clamp circuit 310 could be a zener diode or any other circuitry suitable for clamping the voltage between its terminals to 5V. Transistor 318 is coupled between intermediate terminal 328 and a switch terminal SW. In at least one example, transistor 318 is an NFET. Gate driver 316 has an output coupled to the gate of transistor 318.

Clamp circuit 312 is coupled between the gate of transistor 308 and the switch terminal SW. Clamp circuit 312 is a circuit that clamps the voltage between the gate of transistor 308 and the switch terminal SW to a voltage no greater than 100V. The clamping voltage of clamp circuit 312 may be different in other cases, and should be adjusted to match the drain-to-source voltage rating of transistor 318. Clamp circuit 312 could be a series stack of zener diodes, a single 100V avalanche diode, multiple avalanche diodes in series adding to 100V, or any other circuitry suitable for clamping the voltage between its terminals to 100V.

Diode 314 has a cathode coupled to the gate of transistor 308, and an anode coupled to a DC voltage supply VDD. Capacitor 320 is coupled between DC voltage supply VDD and the switch terminal SW. Diode 324 is coupled between the switch terminal SW and a ground terminal. An L-C filter that includes inductor 322 and capacitor 326 is coupled between the switch terminal SW and the ground terminal.

Transistor 318 is the main voltage regulator switching transistor of high voltage drive circuit 300, and is being controlled through gate driver 316, whose output is coupled to the gate of transistor 318. Transistor 308 is a 100V transistor that adds 100V to the overall voltage rating of the cascoded transistor pair. The gate of transistor 308 is controlled by a clamping voltage, and is not dynamically driven by a gate driver in the same manner as transistor 318.

When transistor 318 is turned off, the voltage at the switching terminal SW will begin at the voltage at input voltage terminal VIN, then decrease until it reaches ground. With the voltage at the switching terminal SW at ground, the full 200V will be dropped between the input voltage terminal VIN and the switching terminal SW. Clamp circuit 312 will not allow the voltage at the gate of transistor 308 to go higher than 100V because clamp circuit 312 clamps the voltage at the gate of transistor 308 to 100V above the voltage at the switching terminal SW.

When the voltage at the gate of transistor 308 is at 100V, the voltage at the source of transistor 308 will be 100V minus a diode drop (Vas of transistor 308). Because transistor 318 is turned off, there will be no current flowing through transistor 318. However, there may be some parasitic capacitance between the drain and source of transistor 308, and there may also be parasitic capacitance between the drain and the substrate of transistor 318. So, the voltage at the source of transistor 308 may not automatically drop in response to the gate of transistor 308 being pulled down. But, clamp circuit 310 ensures that the voltage at the source of transistor 308 also drops when transistor 318 is turned off.

The combination of clamp circuit 310 and clamp circuit 312 ensures that the voltage at the drain of transistor 318 does not exceed 100V. Without this clamp circuit combination, the voltage at the intermediate terminal 328 could remain high due to parasitic capacitances even if the voltage at the switching terminal SW has dropped to near ground. The voltage at the gate of transistor 308 drops from 205V to 100V, and the voltage at the intermediate terminal 328 will remain high. However, the voltage at the intermediate terminal 328 is clamped to 100V plus a forward diode voltage drop.

Resistor 304 allows transistor 308 to remain turned on when transistor 318 is turned off, so that transistor 308 can act as a follower and keep the voltage at the intermediate terminal below 100V. The voltage at the gate of transistor 308 is 100V above the voltage at the switching terminal SW. Resistor 304 and diode 302 provide a pullup path for the gate of transistor 308. The voltage at the source of transistor 308 is a diode voltage drop (Vas) below the voltage at its gate.

Clamp circuit 306 may not be required in every case, but may also be included in the circuit to provide added reliability to ensure that the maximum rated voltage of transistor 308 is not exceeded. In some cases, clamp circuit 312 may provide sufficient protection against an overvoltage condition on transistor 308, making clamp circuit 306 redundant protection. Resistor 304 keeps the gate of transistor 308 biased at 100V above the voltage at the switching terminal SW so that transistor 308 acts as a follower. Initially, capacitor 320 is discharging, but eventually transistor 308 will turn on, making the voltage at the intermediate terminal 328 equal to 100V minus a Vas of transistor 308.

When transistor 318 is turned on, clamp circuit 310 ensures that the $V_{GS}$ of transistor 308 does not exceed its maximum rated gate-to-source voltage. So, clamp circuit 310 provides gate-to-source voltage protection of transistor 308. Diode 314 pulls the voltage at the gate of transistor 308 to the voltage at the switching terminal SW plus 5V, ensuring that transistor 308 is fully enhanced.

Diode 302 allows the voltage at the gate of M1 to go above the voltage at the input voltage terminal VIN. When the voltage at the switching terminal SW goes high to turn on transistor 318, the voltage at the intermediate terminal 328 will come to the same voltage as the switching terminal SW. When this occurs, the voltage at the gate of transistor 308 will begin pulling up through diode 314 as the voltage at the switching terminal SW continues to rise.

Eventually, the voltages at both the gate of transistor 308 and the gate of transistor 318 will be equal to the voltage at the switching terminal SW plus VDD. So, when the voltage at the gate of transistor 308 is at 205V and the voltage at the input voltage terminal VIN is at 200V, the path through diode 302 and resistor 304 will be blocked, preventing resistor 304 from discharging capacitor 320 through the input voltage terminal VIN. Diode 302 blocks the reverse current. When transistor 308 is fully turned on, the voltage at the gate of transistor 308 is higher than the voltage at the input voltage terminal VIN, so that transistor 308 is fully enhanced.

With the voltage at the input voltage terminal VIN at 200 V, the voltage at the gate of transistor 308 is driven to no higher than 100V above the voltage at the switching terminal SW so that transistor 308 acts as a follower. When transistor 308 and transistor 318 are each turned off, the voltage at the intermediate terminal 328 is at 100V minus a Vas voltage drop. Therefore, both transistor 318 and transistor 308 have a drain-to-source voltage of 100V, which is within their respective voltage ratings.

When transistor 308 and transistor 318 are each turned on, the voltages at each of their gates are above the voltage at the input voltage terminal VIN. If the gate of transistor 318 is driven to a voltage 5V above the voltage at the input voltage terminal VIN, the voltage at the gate of transistor 308 will also go to 5V above the voltage at the input voltage terminal VIN. So, both transistors will be fully enhanced and fully turned on.

The DC supply voltage VDD is at 5V above the voltage at the switching terminal SW, and will vary as the voltage at the switching terminal SW varies. The DC supply voltage VDD is a floating supply whose current is supplied from capacitor 320. Capacitor 320 may be internal or external to the device. The voltage supply terminal of gate driver 316 is coupled to the DC supply voltage VDD.

In high voltage drive circuit 300, transistor 308 and transistor 318 are each 100V rated transistors, providing a 200V rated cascode pair. However, higher voltage rated transistors may be cascoded to achieve higher voltage ratings. Although transistor 308 and transistor 318 each have the same voltage rating, transistors of different voltage ratings may be cascoded to achieve the desired voltage rating. For example, if a system has a maximum input voltage specification of 180V, an 85V transistor can be cascoded with a 100V transistor to meet that maximum voltage specification. Furthermore, more than two transistors may be cascoded together to achieve higher maximum voltage ratings.

In this description, "terminal," "node," "interconnection," "lead" and "pin" are used interchangeably. Unless specifically stated to the contrary, these terms generally mean an interconnection between or a terminus of a device element, a circuit element, an integrated circuit, a device, or other electronics or semiconductor component.

In this description, "ground" includes a chassis ground, an Earth ground, a floating ground, a virtual ground, a digital ground, a common ground and/or any other form of ground connection applicable to, or suitable for, the teachings of this description.

In this description, the term "couple" may cover connections, communications or signal paths that enable a functional relationship consistent with this description. For example, if device A generates a signal to control device B to perform an action, then: (a) in a first example, device A is coupled to device B by direct connection; or (b) in a second example, device A is coupled to device B through intervening component C if intervening component C does not alter the functional relationship between device A and device B, so device B is controlled by device A via the control signal generated by device A.

In this description, even if operations are described in a particular order, some operations may be optional, and the operations are not necessarily required to be performed in that particular order to achieve specified results. In some examples, multitasking and parallel processing may be advantageous. Moreover, a separation of various system components in the embodiments described above does not necessarily require such separation in all embodiments.

Modifications are possible in the described embodiments, and other embodiments are possible, within the scope of the claims.

What is claimed is:

1. A circuit comprising:
   a first transistor having first and second terminals and a control terminal, the first terminal coupled to an input voltage terminal;
   a second transistor having a first terminal coupled to the second terminal of the first transistor and having a second terminal coupled to switching terminal;
   a first diode having a first anode and a first cathode, wherein the first anode is coupled to the input voltage terminal;
   a resistor having a first terminal coupled to the first cathode and having a second terminal coupled to the control terminal;
   a first voltage clamp circuit having a first terminal coupled to the control terminal and having a second terminal coupled to the second terminal of the first transistor and to the first terminal of the second transistor;
   a second voltage clamp circuit having a first terminal coupled to the control terminal and having a second terminal coupled to a voltage supply terminal; and
   a second diode having a second cathode coupled to the control terminal and having a second anode coupled to the voltage supply terminal.

2. The circuit of claim 1, further comprising a capacitor coupled between the voltage supply terminal and the switching terminal.

3. The circuit of claim 1, wherein the first voltage clamp has a clamping voltage equal to a voltage at the voltage supply terminal.

4. The circuit of claim 3, wherein the second voltage clamp has a clamping voltage equal to the first maximum voltage rating.

5. The circuit of claim 1, further comprising a third voltage clamp circuit coupled in parallel with the resistor.

6. The circuit of claim 5, wherein the third voltage clamp has a clamping voltage equal to the clamping voltage of the second voltage clamp circuit.

7. The circuit of claim 1, further comprising a gate drive circuit having an output coupled to a control terminal of the second transistor and having a supply input terminal coupled to the voltage supply terminal.

8. The circuit of claim 1, further comprising an inductor coupled between the switching terminal and an output voltage terminal.

9. The circuit of claim 1, wherein the circuit is included in a voltage regulator circuit.

10. The circuit of claim 9, wherein the voltage regulator circuit is a buck voltage regulator circuit.

11. The circuit of claim 1, wherein a first maximum voltage rating of the first transistor is equal to a second maximum voltage rating of the second transistor.

12. The circuit of claim 3, wherein the first and second transistors are each a n-channel field effect transistor (NFET).

13. A voltage regulator circuit comprising:
    a gate drive circuit having a supply input terminal and a gate drive output, wherein the supply input terminal is coupled to a voltage supply terminal;
    a first transistor coupled between an input voltage terminal and an intermediate terminal, and having a first control terminal;
    a second transistor coupled between the intermediate terminal and a switching terminal and having a second control terminal, wherein the second control terminal is coupled to the gate drive output;
    a first diode having a first anode and a first cathode, wherein the first anode is coupled to the input voltage terminal;
    a resistor coupled between the first cathode and the first control terminal;
    a first voltage clamp circuit coupled between the first control terminal and the intermediate terminal;
    a second voltage clamp circuit coupled between the first control terminal and the switching terminal; and
    a second diode coupled between the first control terminal and the voltage supply terminal.

14. The voltage regulator circuit of claim 13, wherein the first voltage clamp has a clamping voltage equal to a voltage at the voltage supply terminal.

15. The voltage regulator circuit of claim 14, wherein the second voltage clamp has a clamping voltage equal to the first maximum voltage rating.

16. The voltage regulator circuit of claim 13, further comprising:
    an inductor coupled between the switching terminal and an output voltage terminal;
    a diode coupled between the switching terminal and a ground terminal; and
    a capacitor coupled between the output voltage terminal and the ground terminal.

17. The voltage regulator circuit of claim 13, further comprising a third voltage clamp circuit coupled in parallel with the resistor.

18. The voltage regulator circuit of claim 17, wherein the third voltage clamp has a clamping voltage equal to the clamping voltage of the second voltage clamp circuit.

19. The voltage regulator circuit of claim 18, wherein a first maximum voltage rating of the first transistor is equal to a second maximum voltage rating of the second transistor.

20. The voltage regulator circuit of claim 15, wherein the first and second transistors are each a n-channel field effect transistor (NFET).

21. The circuit of claim 1, wherein the control terminal of the first transistor is a first control terminal, and the second transistor has a second control terminal that is capable of being driven separately from the first control terminal.

* * * * *